United States Patent [19]

Moench et al.

[11] 4,356,412

[45] Oct. 26, 1982

[54] SUBSTRATE BIAS REGULATOR

[75] Inventors: Jerry D. Moench; Rodney C. Tesch, both of Austin, Tex.

[73] Assignee: Motorola, Inc., Schaumburg, Ill.

[21] Appl. No.: 260,571

[22] Filed: May 5, 1981

Related U.S. Application Data

[63] Continuation of Ser. No. 17,523, Mar. 5, 1979, abandoned.

[51] Int. Cl.[3] .......................... H03K 3/01; H03K 3/353

[52] U.S. Cl. .................................. 307/304; 307/296 R

[58] Field of Search .............. 307/304, 296 R; 357/41

[56] References Cited

U.S. PATENT DOCUMENTS

| | | | |
|---|---|---|---|
| T954,006 | 1/1977 | Lee et al. | 307/304 |
| 3,609,414 | 9/1971 | Pleshko | 307/304 |
| 3,806,741 | 4/1974 | Smith | 307/304 |
| 4,049,980 | 9/1977 | Maitland | 307/304 |
| 4,093,875 | 6/1978 | Kneppez | 307/251 |
| 4,260,909 | 4/1981 | Dumbri et al. | 307/297 |

*Primary Examiner*—Harold A. Dixon

*Attorney, Agent, or Firm*—Anthony J. Sarli, Jr.; Jeffrey Van Myers; James L. Clingan, Jr.

[57] ABSTRACT

A substrate bias regulator useful for controlling a variable output oscillator and/or a substrate bias voltage generator is provided to control the substrate voltage on a semiconductor chip. A series of field effect transistors are arranged in a manner to sense the substrate voltage and to provide an output to regulate the substrate voltage. One of the series field effect transistors has its gate electrode connected to reference potential ground which tends to make the regulator independent of transistor thresholds.

6 Claims, 3 Drawing Figures

SUBSTRATE BIAS REGULATOR

This application is a continuation of application Ser. No. 017,523, filed Mar. 5, 1979, now abandoned.

This invention relates, in general, to semiconductor substrate bias circuits, and more particularly, to a regulator to regulate substrate bias voltage generators.

To achieve high performing dynamic random access memories (RAM) a negative substrate voltage is required. In dynamic RAMs certain nodes are charged to a given voltage. These nodes do not have a current source and must therefore be periodically, e.g. every 2 milliseconds, refreshed or recharged. These nodes are capacitively coupled to the semiconductor substrate and since much of the capacitance associated with these nodes is substrate capacitance, the voltage on the nodes will change approximately directly with substrate voltage changes.

In the past, in some cases, a negative voltage was applied from an external power supply to the substrate. However, this required an extra power supply which was inconvenient, especially, for single power supply devices. To eliminate the requirement of an external power supply, ring oscillators were built on the substrate and used to drive a charge pump or bias voltage generator which would supply a negative voltage to the substrate. A disadvantage to this approach is that the substrate voltage would then vary when the semiconductor chip power supply varied. Sometimes the substrate bias voltage would tend to vary a greater amount than the power supply voltage variation.

Accordingly, it is an object of the present invention to provide an improved substrate bias regulator to regulate the substrate bias voltage of a semiconductor chip to a predetermined ratio of the power supply of the chip.

Another object of the present invention is to provide a substrate bias regulator which is useful in minimizing the high output impedance effects of a substrate bias voltage generator.

Yet another object of the present invention is to provide a substrate bias voltage which varies percentage wise the same amount as the supply voltage varies.

SUMMARY OF THE INVENTION

In carrying out the above and other objects of the present invention in one form, there is provided a substrate bias regulator for controlling the output of an oscillator and a substrate bias voltage generator. The regulator comprises a series of field effect transistors for producing an output bearing a relation to the substrate voltage. One of the series of field effect transistors has its source electrode connected directly to the substrate for sensing the voltage of the substrate. This same field effect transistor or another one of the series of field effect transistors has its gate electrode coupled to a reference. The series of field effect transistors produce an output which is coupled to an amplifier. The amplifier amplifies the output so that the output may be useful in controlling the output of the oscillator and the output of the substrate bias voltage generator.

The subject matter which is regarded as the invention is set forth in the appended claims. The invention itself, however, together with further objects and advantages thereof, may be better understood by referring to the following detailed description taken in conjunction with the accompanying drawings.

The exemplifications set out herein illustrate the preferred embodiments of the invention in one form thereof, and such exemplifications are not to be construed as limiting in any manner.

DETAILED DESCRIPTION OF THE DRAWINGS

Figure 1:
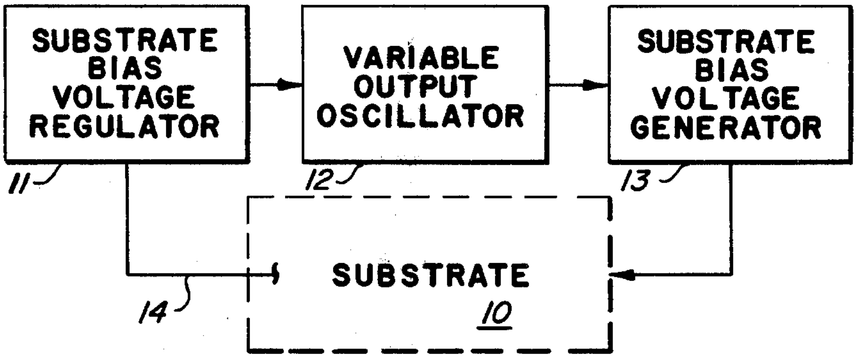
FIG. 1 illustrates in block diagram form a substrate bias generating system embodying the present invention.

Referring first to FIG. 1, there is illustrated in block diagram form a system for generating a substrate bias voltage for substrate 10. Substrate 10 would typically be a substrate for a semiconductor chip. The circuitry for the semiconductor chip is formed upon substrate 10. A variable output oscillator 12, such as a ring type oscillator, provides an output whose voltage varies in time thereby driving substrate bias voltage generator 13. Oscillators and bias generators useful for oscillator 12 and generator 13 are well known in the art. Bias generator 13 preferably generates a negative voltage which is coupled to substrate 10. Bias generator 13 can be of the type which couples the output of oscillator 12 through a capacitor to diodes arranged in a voltage doubling manner to generate a negative voltage. Substrate bias voltage regulator 11 monitors the negative voltage of substrate 10 through connection 14. Regulator 11 provides an output to oscillator 12 which can control the output of oscillator 12 by inhibiting the output from oscillator 12 or else by simply controlling one of the stages of oscillator 12 to thereby reduce its output. Although regulator 11 is illustrated as controlling oscillator 12 it will be understood that the output of regulator 11 could also be used to control the output from substrate bias generator 13. On a semiconductor chip having a single positive power supply, regulator 11 and oscillator 12 can be powered from the single supply and generator 13, which is powered by the oscillator, can be used to generate a negative voltage for substrate 10.

Figure 2:
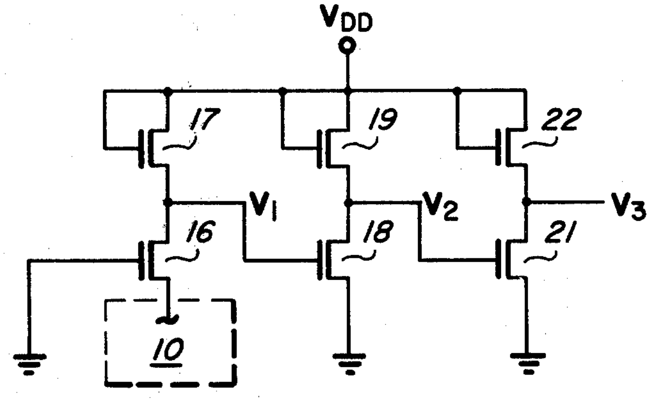
FIG. 2 illustrates in schematic form an embodiment of the present invention.

FIG. 2 illustrates in schematic form a regulator which can be used for substrate bias voltage regulator 11 of FIG. 1. The circuit of FIG. 2 shows two series connected transistors 16 and 17 which sense the voltage of substrate 10 and provide an output V1 bearing a relationship to the voltage of substrate 10. Transistor 17 has its gate and drain connected to voltage terminal $V_{DD}$. Transistor 17 has its source connected to the drain of transistor 16 forming a node providing output V1. The source of transistor 16 is connected directly to substrate 10 and is used to sense the voltage of substrate 10. Transistor 16 has its gate connected to a reference potential terminal illustrated as ground. There are several advantages to using ground as a reference. The first is that the substrate bias voltage is not dependent upon threshold values of the transistors. Also the equations for calculating voltage V1 are easier to solve if the gate electrode of transistor 16 is tied to ground. And with the gate of transistor 16 tied to ground, transistor 16 operates in the saturated region as does transistor 17, and this makes the voltage equations solve nicely without being threshold dependent.

Voltage V1 is coupled to the gate electrode of transistor 18. Transistor 18 has its source connected to reference potential ground. Transistor 19 is connected in series with transistor 18 and has its gate and drain electrodes connected to voltage terminal $V_{DD}$. The source of transistor 19 is connected to the drain of transistor 18 to form a node from which voltage V2 is obtained. Voltage V2 is illustrated as going to a gate electrode of transistor 21. Transistors 21 and 22 are in series between reference potential ground and voltage terminal $V_{DD}$. Transistor 22 has its gate electrode connected to its drain electrode. Transistors 21 and 22 serve as a buffer and receive voltage V2 as an input and provide voltage V3 as an output. It should be noted that voltage V2 can serve as an output from the circuitry of FIG. 2 which would then be connected to oscillator 12 or generator 13. In other words, the inverting buffer provided by transistors 21 and 22 may not be required in certain applications. Transistor 18 is preferably of a larger size than transistor 19 to provide a gain through transistors 18 and 19. Transistors 18 and 19, as illustrated, serve as an inverting amplifier by amplifying voltage V1 and providing it as an inverted voltage V2.

The circuit illustrated in FIG. 2 will provide an output voltage of approximately minus $V_{DD}$ divided by 2. When voltage V1 is higher than the threshold voltage of transistor 18, transistor 18 will conduct thereby making voltage V2 low, which will inhibit the conduction of transistor 21 to provide a high output voltage V3. When voltage V1 is below the threshold voltage of transistor 18 then transistor 18 will not be enabled and voltage V2 will be high, or in other words, equal to the voltage appearing at terminal $V_{DD}$ minus the threshold voltage of transistor 19. When voltage V2 is high, transistor 21 will be enabled thereby rendering voltage V3 low or approximately equal to the voltage at the source of transistor 21, which, as illustrated, is ground.

The circuit of FIG. 2 provides the most useful regulating output when voltage V1 equals the threshold voltage plus a small $\Delta V$. The $\Delta V$ is caused by the ratio of transistors 18 and 19 and can therefore be minimized by selection of the ratio. The current through transistor 17 can be approximated by the following equation:

$$I_{17}=K_{17}(V_{DD}-2V_T-\Delta V)^2$$

where $I_{17}$ equals the current through transistor 17; $K_{17}$ is a constant associated with transistor 17 which is determined by width, length, and other parameters of transistor 17; $V_{DD}$ is the voltage at terminal $V_{DD}$; $V_T$ is the threshold voltage of transistor 17; and $\Delta V$ is a slight increase of voltage needed over the threshold voltage to make transistor 18 conduct. The current through transistor 16 will be the same as the current through transistor 17 since they are both in series and can be set out as:

$$I_{16}=K_{16}(-V_{SUB}-V_T)^2$$

where $I_{16}$ equals the current through transistor 16; $K_{16}$ is the constant associated with transistor 16; and $V_{SUB}$ is the voltage in substrate 10; and $V_T$ is the threshold voltage of transistor 16. If transistors 16 and 17 are made such that $K_{16}$ equals $4K_{17}$ the two equations can be combined as follows:

$$K_{17}(V_{DD}-2V_T-\Delta V)^2=4K_{17}(-V_{SUB}-V_T)^2$$

If the square root of each side of the equation is taken and $K_{17}$ is cancelled on each side, then we have:

$$V_{DD}-2V_T-\Delta V=-2V_{SUB}-2V_T$$

The $2V_T$ from each side of the equation can be cancelled and the equation can be reduced to $$V_{SUB}=-V_{DD}/2+\Delta V/2$$

If transistor 19 is made much, much smaller than transistor 18 then $\Delta V$ will be much, much smaller than $V_{DD}$ and the equation can be further reduced to $$V_{SUB}\doteq -V_{DD}/2$$

The above equations are only approximately valid and do not include all physical aspects of the transistors, however, they are close enough for practical considerations.

When the substrate voltage $V_{SUB}$ is more positive than minus $V_{DD}$ over two, V1 will be greater than a threshold voltage $V_T$; this produces a high voltage V3 allowing the substrate generator to pump to a more negative voltage. When the substrate voltage $V_{SUB}$ is more negative than minus $V_{DD}$ over two, V1 will be less than a threshold voltage $V_T$. This produces a low voltage V3, disabling the generator which then ceases to pump the substrate to a more negative voltage. With the generator disabled transistors 16 and 17 provide a current path to the substrate charging the substrate back to minus $V_{DD}$ over two. At this voltage the generator will be enabled again. This feature of forcing the substrate to minus $V_{DD}$ over two from either direction, a higher substrate voltage or a lower substrate voltage, results in minimization of the high output impedance of the substrate voltage generator.

As can be seen from the above equation, the substrate voltage can be controlled to within approximately one-half of the voltage applied to terminal $V_{DD}$. With the regulator of FIG. 2 the substrate voltage can be controlled to within the same percentage as the voltage $V_{DD}$. For example, if voltage $V_{DD}$ changes 10 percent the substrate voltage will change 10 percent also.

Figure 3:
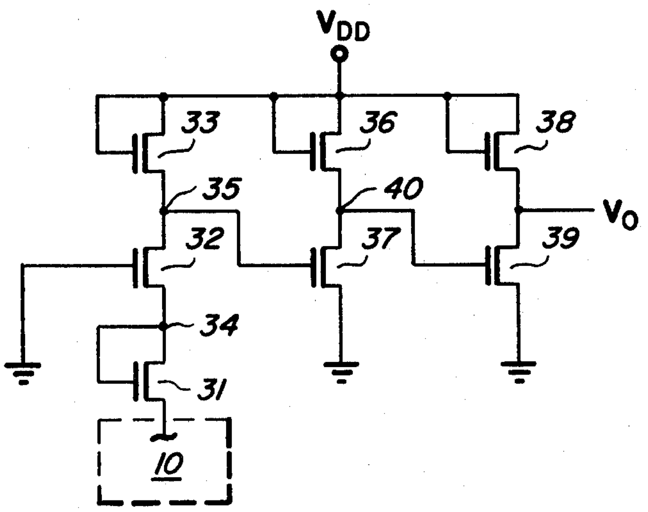
FIG. 3 illustrates in schematic form another embodiment of the present invention.

FIG. 3 illustrates another embodiment for the substrate bias voltage regulator 11 in FIG. 1. The regulator of FIG. 3 is capable of regulating the substrate voltage to approximately a negative $V_{DD}$. Three series transistors 31, 32, and 33 are connected between substrate 10 and voltage terminal $V_{DD}$ to provide an output at node 35 which can be used to regulate the voltage at substrate 10. Transistor 31 has its source connected directly to substrate 10 and its gate and drain electrodes connected together to form node 34. Transistor 32 has its source connected to node 34 and its gate electrode connected to reference potential ground. Transistor 33 has its drain and gate electrodes connected to voltage terminal $V_{DD}$ and its source electrode connected to the drain electrode of transistor 32 to form node 35.

Transistors 36 and 37 are in series and take the signal at node 35 which is coupled to the gate electrode of transistor 37 and provide an amplified inverted output at node 40. The drain of transistor 37 is tied to the source of transistor 36 to form node 40. Transistor 36 has its gate and drain electrodes connected to voltage terminal $V_{DD}$. Transistors 38 and 39 form a buffer for the signal at node 40 and provide output $V_O$. The output $V_O$ will be in-phase with the signal at node 35. If the in-phase signal is not needed to control an oscillator or voltage bias generator then the output from node 40 can be used.

The equations determining the substrate voltage that will be provided by the regulator of FIG. 3 are similar to the equations for FIG. 2. If transistor 31 is much greater in physical size than transistor 32 the voltage at node 34 will equal the substrate 10 voltage plus the threshold voltage of transistor 31. The slight increase of voltage needed to overcome the threshold voltage will be neglected since as shown hereinbefore it is much much smaller than $V_{DD}$. The current through transistor 33 can be expressed by the following equation:

$$I_{33}=K_{33}(V_{DD}-2V_T)^2$$

where $K_{33}$ is the constant for transistor 33; $V_{DD}$ is the voltage at voltage terminal $V_{DD}$; and $V_T$ is the threshold voltage. The current through transistor 32 will equal the current through transistor 33 and can be expressed by the following equation:

$$I_{32}=K_{32}(-V_{SUB}-2V_T)^2$$

$K_{32}$ is the constant for transistor 32; $V_{SUB}$ is the voltage of substrate 10; and $V_T$ is the transistor threshold. If $K_{33}$ equals $K_{32}$ the equations can be quickly reduced in the same manner as the equation of FIG. 2 were reduced to show that $V_{DD}$ equals approximately minus $V_{SUB}$.

By now it should be appreciated that there has been provided a regulator circuit which will regulate the substrate voltage in a semiconductor chip. By using the substrate bias voltage regulator the high output impedance associated with substrate bias voltage generators is overcome. When the voltage regulator is regulating no current is drawn from the substrate bias voltage generator and its output voltage will remain constant. Because of the high output impedance associated with substrate voltage generators, if current is drawn from the output, the output voltage will decrease. Another advantage resulting from the use of the substrate bias voltage regulator, of the present invention, is that when the semiconductor chip is still a part of a silicon wafer, probe test can be performed on the chip in a much more reliable fashion since the probe test operator will know the value of substrate voltage to apply to the wafer. Although only two embodiments of the substrate bias voltage regulator are illustrated, it will be apparent to those skilled in the art that other values of substrate voltage can be obtained by following the teachings of the present invention.

We claim:

1. A substrate bias voltage regulator for controlling a substrate bias voltage generator to provide a predetermined substrate bias voltage to a semiconductor substrate, comprising:

a first field effect transistor having a first electrode and a gate electrode coupled to a first supply voltage, and a second electrode;

a second field effect transistor having a first electrode coupled to the second electrode of the first transistor, a second electrode connected directly to the substrate, and a gate electrode directly connected to ground without intervening elements, the second transistor developing a control voltage on the first electrode thereof which is related to the deviation from the predetermined substrate bias voltage of the bias voltage developed on the substrate by the substrate bias voltage generator; and amplifier means for coupling the control voltage developed on the first electrode of the second transistor to the substrate bias voltage generator to control the operation thereof.

2. A substrate bias voltage regulator for controlling a substrate bias voltage generator to provide a predetermined substrate bias voltage to a semiconductor substrate, comprising:

a first field effect transistor having a first electrode and a gate electrode coupled to a first supply voltage, and a second electrode;

a second field effect transistor having a first electrode coupled to the second electrode of the first transistor, a gate electrode coupled to a reference terminal, and a second electrode;

a series field effect transistor having a gate and a first electrode coupled to the second electrode of the second transistor, and a second electrode connected directly to the substrate to sense the substrate voltage, wherein the second transistor develops a control voltage on the first electrode thereof which is related to the deviation from the predetermined substrate bias voltage of the bias voltage developed on the substrate by the substrate bias voltage generator; and amplifier means for coupling the control voltage developed on the first electrode of the second transistor to the substrate bias voltage generator to control the operation thereof.

3. The substrate bias voltage regulator of claim 1 or claim 2 wherein the amplifier means is further characterized as providing a first voltage when the control voltage developed on the first electrode of the second transistor is higher than a predetermined voltage level.

4. The substrate bias voltage regulator of claim 2 wherein the amplifier means further comprises:

a third field effect transistor having a first electrode and a gate electrode coupled to the first supply voltage, and a second electrode; and a fourth field effect transistor having a first electrode coupled to the second electrode of the third transistor, a second electrode coupled to ground, and a gate electrode coupled to the first electrode of the second transistor,the fourth transistor developing an output voltage on the first electrode thereof which is coupled to the substrate bias voltage generator to control the operation thereof.

5. The substrate bias voltage regulator of claim 4 wherein the fourth transistor is further characterized as having a threshold voltage equal to the predetermined voltage level of the amplifier means.

6. A substrate bias voltage regulator for controlling a substrate bias voltage generator to provide a predetermined substrate bias voltage to a semiconductor substrate, comprising:

a first field effect transistor having a first current electrode and a gate electrode coupled to a first supply voltage, and a second current electrode;

a second field effect transistor having a first current electrode coupled to the second current electrode of the first transistor, a second current electrode connected directly to the substrate, and a gate electrode coupled to a reference voltage, the second transistor developing a control voltage on the first electrode thereof which is related to the deviation from the predetermined substrate bias voltage of the bias voltage developed on the substrate by the substrate bias voltage generator;

a third transistor having a first current electrode coupled to ground, a gate electrode coupled to the first current electrode of the second transistor, and a second current electrode; and a fourth transistor coupled between the first supply voltage and the second current electrode of the third transistor, the third transistor developing an output voltage on the second current electrode thereof which is coupled to the substrate bias voltage generator to control the operation thereof.

* * * * *

UNITED STATES PATENT AND TRADEMARK OFFICE
CERTIFICATE OF CORRECTION

PATENT NO. : 4,356,412

DATED :

INVENTOR(S) : Jerry D. Moench, Rodney C. Tesch

It is certified that error appears in the above-identified patent and that said Letters Patent are hereby corrected as shown below:

Line 1 of claim 4, "2" should be --3--.

Signed and Sealed this

*Fifteenth* Day of *March 1983*

[SEAL]

*Attest:*

GERALD J. MOSSINGHOFF

*Attesting Officer* *Commissioner of Patents and Trademarks*